(12) United States Patent
Govekar et al.

(10) Patent No.: US 11,591,033 B2
(45) Date of Patent: Feb. 28, 2023

(54) FOCUSED LIGHT BEAM ALIGNMENT APPARATUS FOR ALIGNING FIXTURE RELATIVE TO A VEHICLE

(71) Applicant: Snap-on Incorporated, Kenosha, WI (US)

(72) Inventors: Craig F. Govekar, Gurnee, IL (US); Edward P. Cahill, Killaloe (IE); Derrick R. Steel, Gurnee, IL (US)

(73) Assignee: Snap-on Incorporated, Kenosha, WI (US)

( * ) Notice: Subject to any disclaimer, the term of this patent is extended or adjusted under 35 U.S.C. 154(b) by 606 days.

(21) Appl. No.: 16/282,559

(22) Filed: Feb. 22, 2019

(65) Prior Publication Data

US 2020/0269939 A1 Aug. 27, 2020

(51) Int. Cl.
*B62D 65/02* (2006.01)
*B62D 65/16* (2006.01)
*G02B 26/12* (2006.01)
*G03F 9/00* (2006.01)

(52) U.S. Cl.
CPC ......... *B62D 65/028* (2013.01); *B62D 65/026* (2013.01); *B62D 65/16* (2013.01); *G02B 26/128* (2013.01); *G03F 9/7026* (2013.01)

(58) Field of Classification Search
CPC .... B62D 65/16; B62D 65/024; B62D 65/026; B62D 65/028; G02B 26/128; G03F 9/7026; F16M 11/046; F16M 11/18; F16M 11/42; G01B 11/27
USPC ....................................................... 356/615
See application file for complete search history.

(56) References Cited

U.S. PATENT DOCUMENTS

| | | | | |
|---|---|---|---|---|
| 4,630,379 A | * | 12/1986 | Wickmann | G01B 11/245 33/288 |
| 5,058,286 A | * | 10/1991 | Chisum | G01B 5/207 33/608 |
| 5,125,164 A | * | 6/1992 | Fournier | G01B 11/27 33/608 |
| 6,823,601 B2 | | 11/2004 | Murray | |
| 6,915,288 B2 | | 7/2005 | Hsieh | |
| 7,121,011 B2 | | 10/2006 | Murray et al. | |
| 7,424,387 B1 | | 9/2008 | Gill et al. | |
| 9,170,101 B2 | | 10/2015 | Stieff | |

(Continued)

FOREIGN PATENT DOCUMENTS

DE 29 48 573 6/1981

OTHER PUBLICATIONS

International Search Report and Written Opinion dated Jul. 24, 2020 for International Application No. PCT/US2020/017947, 13 pages.

*Primary Examiner* — Deoram Persaud
(74) *Attorney, Agent, or Firm* — McDonnell Boehnen Hulbert & Berghoff LLP

(57) ABSTRACT

An apparatus including a focused light beam receptor apparatus configured to be positioned proximate a first end of a vehicle, a focused light beam generator; and wherein the focused light beam receptor apparatus includes a focused light beam receiving surface for receiving a focused light beam from the focused light beam generator to provide alignment of the focused light beam receptor relative to a centerline of the vehicle. A method of aligning a focused light beam receptor, focused light beam generator and a movable alignment stand relative to a centerline of a vehicle is also provided.

38 Claims, 14 Drawing Sheets

(56) References Cited

U.S. PATENT DOCUMENTS

| | | |
|---|---|---|
| 9,821,849 B2 | 11/2017 | Prusinowski |
| 10,323,936 B2 | 6/2019 | Leikert |
| 2018/0052223 A1 | 2/2018 | Stieff et al. |
| 2018/0188022 A1 | 7/2018 | Leikert |
| 2019/0249986 A1 | 8/2019 | Leikert |
| 2021/0080253 A1* | 3/2021 | Newkirk .............. G01B 11/275 |

* cited by examiner

FOCUSED LIGHT BEAM ALIGNMENT APPARATUS FOR ALIGNING FIXTURE RELATIVE TO A VEHICLE

BACKGROUND

The present application is directed to apparatus and methods used to align a movable fixture relative to a vehicle. More particularly, the present application is directed to an apparatus and method for aligning a focused light beam generator with a centerline of a vehicle and aligning a movable fixture relative to a vehicle for the purpose of mounting or adjusting a camera, or other device to the vehicle in a desired location.

Vehicles often come equipped with a camera or other devices to aid in driving and collision avoidance. In some instances, a vehicle is in an accident or a bumper needs to be replaced or adjusted. In order to replace or adjust a camera or other device on the vehicle, it is important that an alignment stand is properly aligned with the vehicle to allow for proper positioning or adjustment of the camera or other device with the vehicle. In the past, a plumb bob was used which was strung over or underneath a vehicle to determine front and back center points of the vehicle and establish a centerline of the vehicle, to provide a proper alignment of a movable stand relative to the vehicle. However, aligning a movable stand using a plumb bob is typically a two-man job. Accordingly, it would be desirable to provide an apparatus and method of aligning a focused light beam generator with a centerline of a vehicle and aligning a movable stand relative to a vehicle to provide proper alignment for mounting or adjusting a camera or other device to or with the vehicle.

SUMMARY

The present disclosure is directed to the use of a focused light beam generator and a focused light beam receptor to align the focused light beam in a desired location relative to a vehicle. The focused light beam receptor is placed in front (or rear) of a vehicle and the focused light beam generator is placed such that the focused light beam receptor is positioned between the focused light beam generator and the vehicle. The focused light beam is directed along a centerline of the vehicle and onto a focused light beam receiving surface on the focused light beam receptor. A vertical marking or slot is aligned with the focused light beam from the focused light beam generator to align and square the focused light beam receptor with the centerline of the vehicle. Vehicles typically have an emblem or marking to show where the centerline of the vehicle is positioned.

A vehicle centerline is a line in a vertical plane extending through a horizontal centerline passing through a vehicle, such as a longitudinal horizontal centerline extending between the front and rear of the vehicle. Once the focused light beam receptor is aligned and squared with the centerline of the vehicle front (or rear), another or the same focused light beam generator is positioned on the opposite end of the vehicle where the focused light beam receptor is positioned. The focused light beam can be directed underneath the vehicle along a centerline of the vehicle. Once the focused light beam generator is properly aligned with the focused light beam receptor such that the focused light beam is centered on both (1) a vertical marking or slot on the focused light beam receiving surface of the focused light beam receptor, and (2) a centerline of the vehicle, a movable alignment stand may be moved into position in the same path of the focused light beam where the focused light beam receptor was positioned, although the alignment stand is typically not positioned against the vehicle but proximate to the vehicle, e.g., up to two meters or more from the vehicle. The alignment stand may then be aligned with the focused light beam from the focused light beam generator. The focused light beam receptor may have a vertical marking or slot to align the focused light beam from the focused light beam generator on the focused light beam receptor. The focused light beam receptor may have a T-shaped construction with a vertical member upwardly extending from the base, and the vertical member is positioned against an end of the vehicle to provide for alignment of the focused light beam on the focused light beam receptor. The alignment stand may also have a focused light beam aligner that is used to align the focused light beam from the focused light beam generator with the focused light beam aligner on the alignment stand.

In one aspect, an apparatus is provided including a focused light beam receptor apparatus configured to be positioned proximate a first end of a vehicle; a focused light beam generator; and wherein the focused light beam receptor apparatus includes a focused light beam receiving surface for receiving a focused light beam from the focused light beam generator to provide alignment of the focused light beam receptor relative to a centerline of the vehicle. The apparatus may further include a movable alignment stand having a base, wheels secured to the base, a vertical member extending upwardly from the base, a horizontal member extending from the vertical member, and a focused light beam aligner secured to the base.

In another aspect, a method is provided including the steps of: (i) positioning a focused light beam receptor proximate a first end of a vehicle; (ii) positioning a focused light beam generator such that the focused light beam receptor is between the first end of the vehicle and the focused light beam generator; (iii) directing one or more focused light beams towards a centerline of the vehicle and towards a focused light beam receiving surface on the focused light beam receptor for aligning and squaring the focused light beam receptor with the centerline of the vehicle; (iv) positioning a focused light beam generator on an opposite end of the vehicle from the first end of the vehicle; (v) directing one or more focused light beams from the focused light beam generator onto the focused light beam receiving surface of the focused light beam receptor; and (vi) aligning the one or more focused light beams on the focused light beam receiving surface of the focused light beam receptor to provide alignment of the focused light beam generator relative to the centerline of the vehicle. The method may further include the steps of: (vii) providing a movable alignment stand having a base, wheels secured to the base, a vertical member extending upwardly from the base, a horizontal member extending from the vertical member, and a focused light beam aligner positioned on the base; and (viii) once the focused light beam generator is properly aligned with the centerline of the vehicle, removing the focused light beam receptor and replacing the focused light beam receptor with the movable alignment stand positioned in a path of the one or more focused light beams from the focused light beam generator.

These as well as other aspects and advantages will become apparent to those of ordinary skill in the art by reading the following detailed description, with reference to the accompanying drawings. Further, it should be understood that the embodiments described in this overview and elsewhere are intended to be examples only and do not necessarily limit the scope of the invention.

BRIEF DESCRIPTION OF THE DRAWINGS

Example embodiments are described herein with reference to the following drawings.

DETAILED DESCRIPTION

In this description, the articles "a," "an," and "the" are used to introduce elements and/or functions of the example embodiments. The intent of using those articles is that there is one or more of the introduced elements and/or functions. In this description, the intent of using the term "and/or" within a list of at least two elements or functions and the intent of using the terms "at least one of" and "one or more of" immediately preceding a list of at least two elements or functions is to cover each embodiment including a listed element or function independently and each embodiment comprising a combination of the listed elements or functions. For example, an embodiment described as comprising A, B, and/or C, or at least one of A, B, and C, or one or more of A, B, and C is intended to cover each of the following possible embodiments: (i) an embodiment comprising A, but not B and C, (ii) an embodiment comprising B, but not A and C, (iii) an embodiment comprising C, but not A and B, (iv) an embodiment comprising A and B, but not C, (v) an embodiment comprising A and C, but not B, (v) an embodiment comprising B and C, but not A, and (vi) an embodiment comprising A, B, and C. For the embodiments comprising element or function A, the embodiments can comprise one A or multiple A. For the embodiments comprising element or function B, the embodiments can comprise one B or multiple B. For the embodiments comprising element or function C, the embodiments can comprise one C or multiple C. In this description, the use of ordinal numbers such as "first," "second," "third" and so on is to distinguish respective elements rather than to denote a particular order of those elements unless the context of using those terms explicitly indicates otherwise.

The diagrams, flow charts, and data shown in the figures are provided merely as examples and are not intended to be limiting. Many of the elements illustrated in the figures and/or described herein are functional elements that can be implemented as discrete or distributed elements, individually or in conjunction with other element(s), and in any suitable combination and/or location. Those skilled in the art will appreciate that other arrangements and elements can be used instead. Furthermore, the functions described as being performed by one or more elements can be carried out by a combination of hardware, firmware, and/or software (e.g., a processor that executes computer-readable program instructions).

Figure 1:
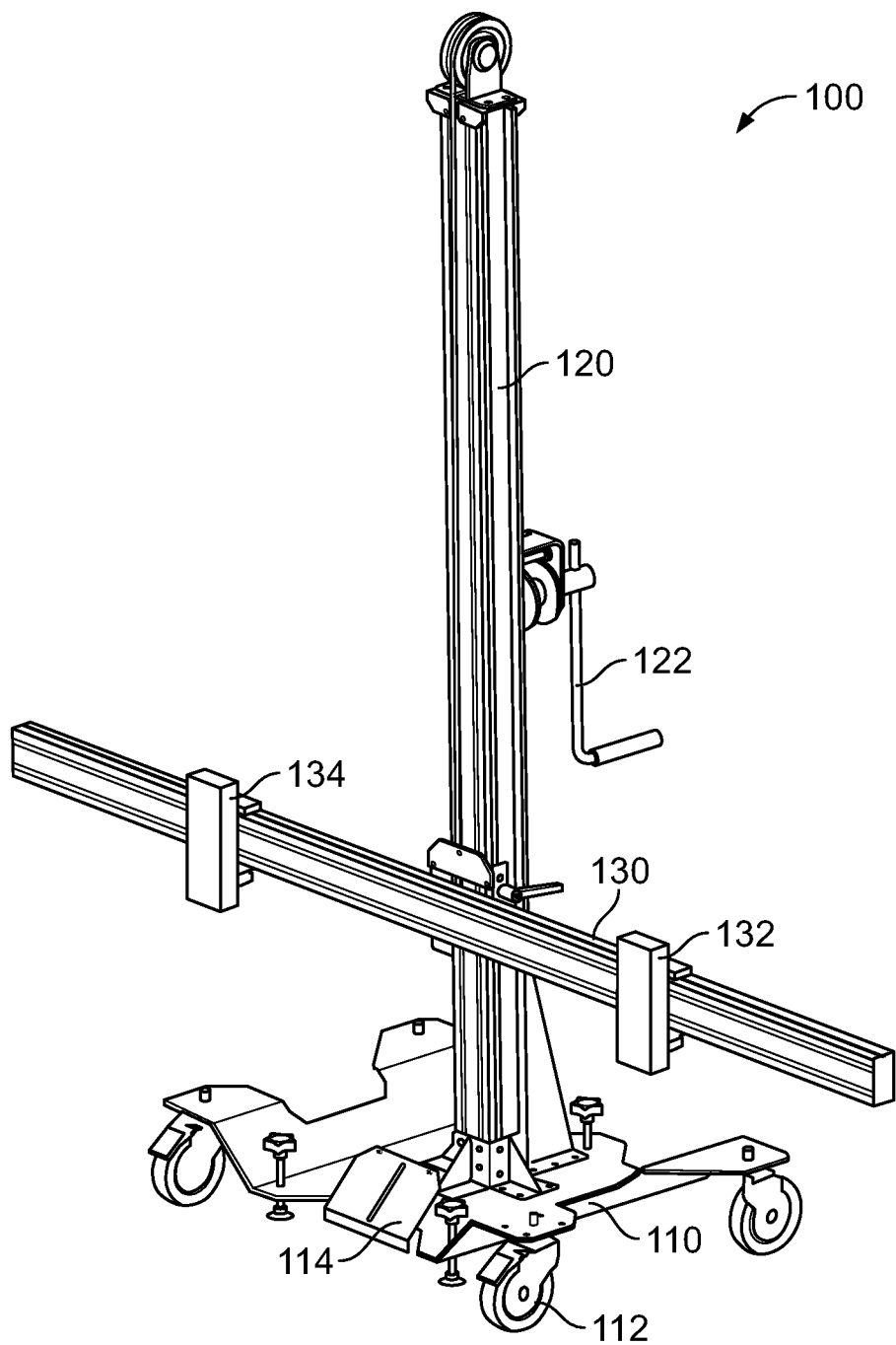
FIG. 1 is a perspective front view of movable alignment apparatus 100, according to an example embodiment.
Figure 2:
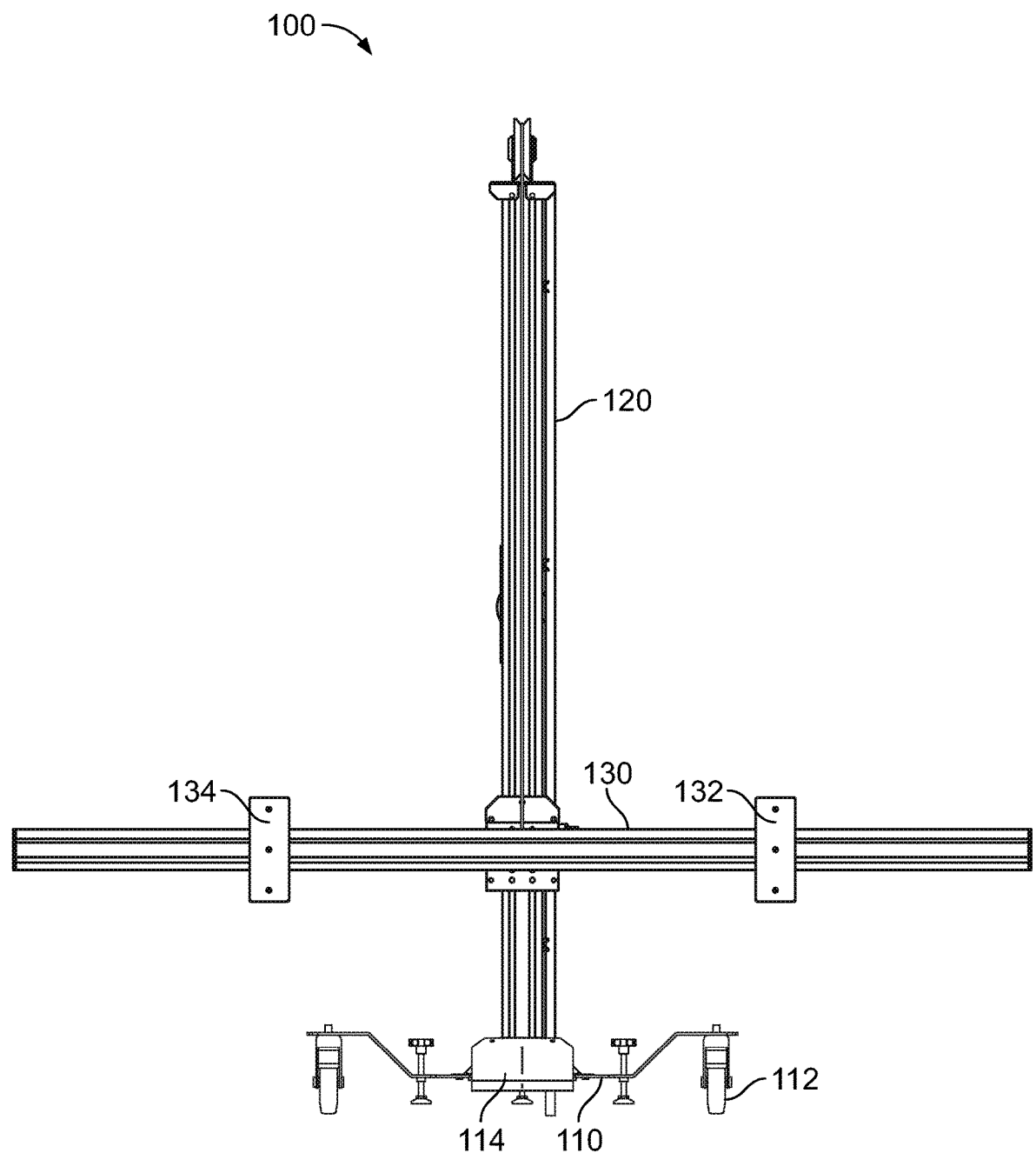
FIG. 2 is a front view of movable alignment apparatus 100 shown in FIG. 1.
Figure 3:
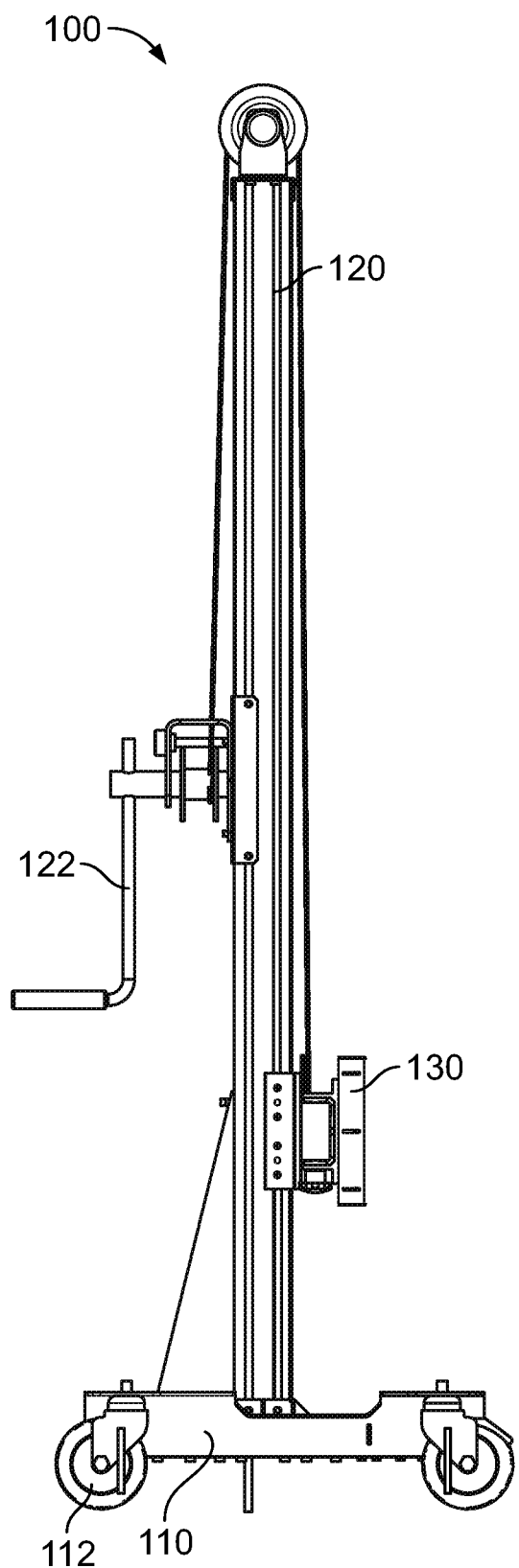
FIG. 3 is a side view of movable alignment apparatus 100 shown in FIGS. 1 and 2.

FIG. 1 is a perspective front view of movable alignment apparatus 100, according to an example embodiment. FIG. 2 is a front view of movable alignment apparatus 100 shown in FIG. 1. FIG. 3 is a side view of movable alignment apparatus 100 shown in FIGS. 1 and 2. Movable alignment apparatus 100 includes a base 110 positioned on wheels 112. A vertical member 120 extends upwardly from base 110. A horizontal member 130 is positioned perpendicular to vertical member 120. Horizontal member 130 may be moved up and down with respect to vertical member 120 using handle 122. Laser target mounts 132 and 134 are positioned on the horizontal member 130. Focused light beam aligner 114 is positioned on base 110 and is adapted to receive a focused light beam, such as a laser beam or collimated light beam, for alignment purposes.

Laser beams or other focused light beams may be used to align the movable alignment apparatus 100 with a centerline of a vehicle to properly align the movable alignment apparatus 100 when mounting or adjusting a camera or other device to or with a vehicle.

Figure 4A:
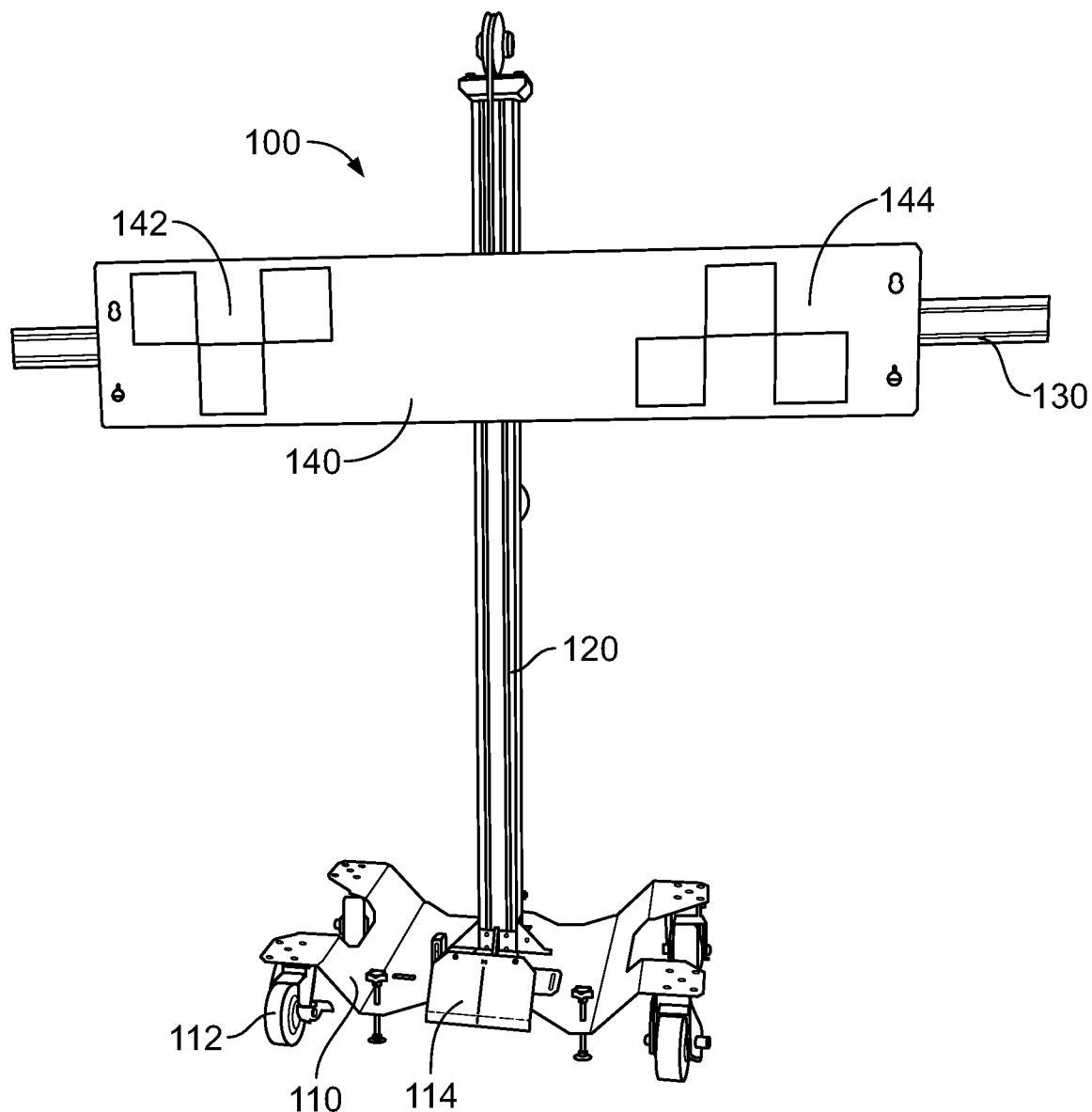
FIG. 4A is a perspective front view of movable alignment apparatus 100 shown in FIGS. 1-3 with laser target board 140 positioned thereon, according to an example embodiment.

FIG. 4A is a perspective front view of movable alignment apparatus 100 shown in FIGS. 1-3 with laser target board 140 positioned thereon, according to an example embodiment. Laser target board 140 includes laser targets 142 and 144.

Figure 4B:
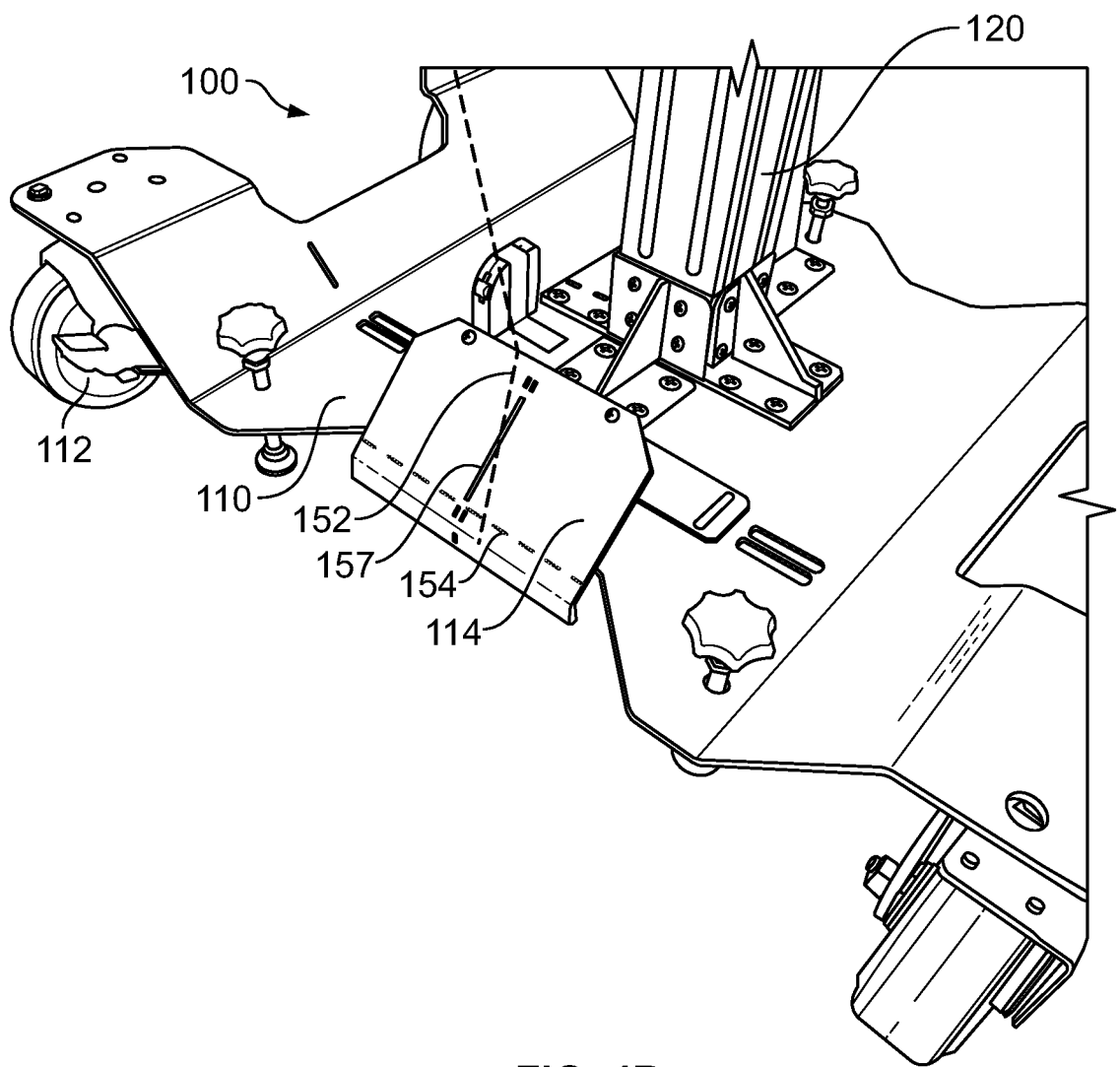
FIG. 4B is a close up view of the movable alignment apparatus 100 shown in FIGS. 1-4A, with a focused light beam aligner 114, according to an example embodiment.

FIG. 4B is a close up view of the movable alignment apparatus 100 shown in FIGS. 1-4A. Focused light beam aligner 114 is shown positioned on base 110 which is in turn mounted over wheels 112.

Before aligning movable alignment apparatus 100 with a vehicle, one step is ensure that the focused light beam(s) from focused light beam generator 150 (shown in FIGS. 6 and 7) is aligned with a centerline of the vehicle. In order to align the focused light beam(s) of focused light beam generator 150 with the centerline of the vehicle, a focused light beam receptor is positioned at the front of the vehicle with a focused light beam receiving surface positioned perpendicular to the centerline of the vehicle. The focused light beam(s) from the focused light beam generator 150 are aligned with an emblem or marking denoting the centerline of the vehicle, and then aligned with a marking or slot on the focused light beam receiving surface of focused light beam receptor 250, such that the focused light beam receptor is aligned with and square to a centerline of the vehicle.

Figure 5A:
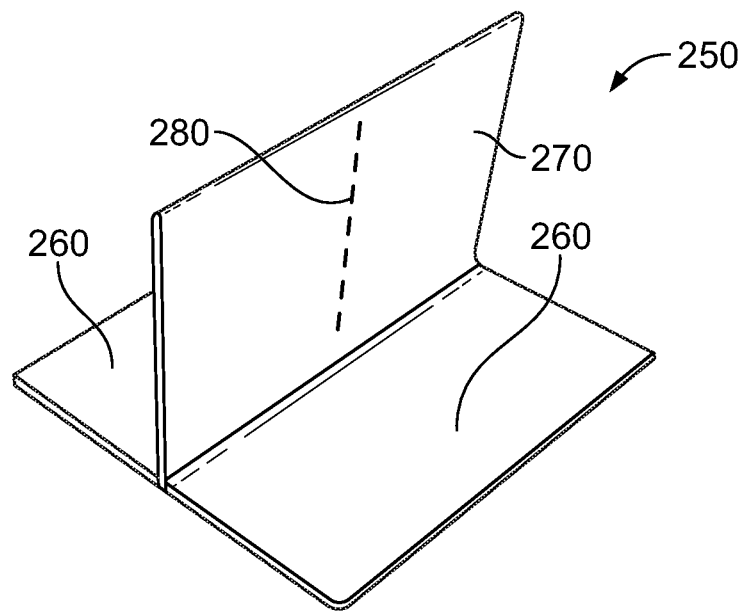
FIG. 5A is a perspective view of focused light beam receptor 250 with vertical marking or slot 280, according to an example embodiment.
Figure 5B:
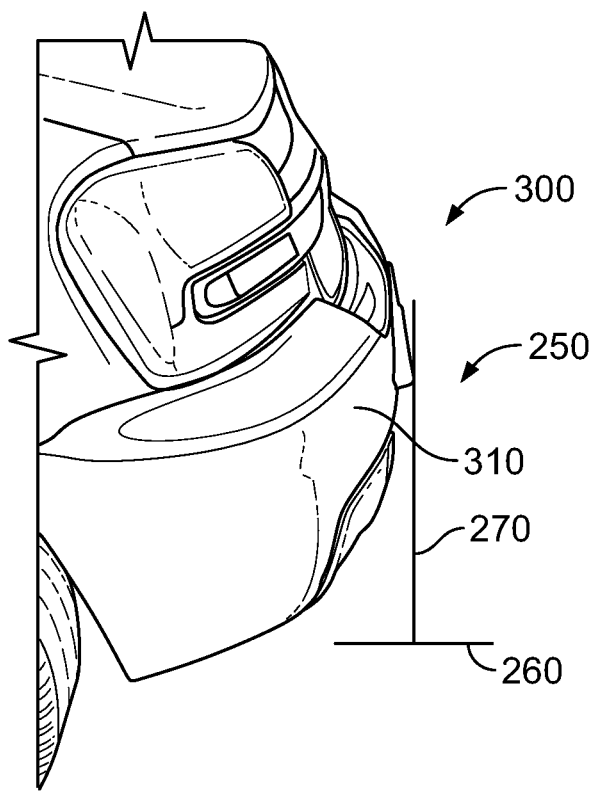
FIG. 5B is a further perspective view of focused light beam receptor 250 positioned in front of vehicle 300.
Figure 9A:
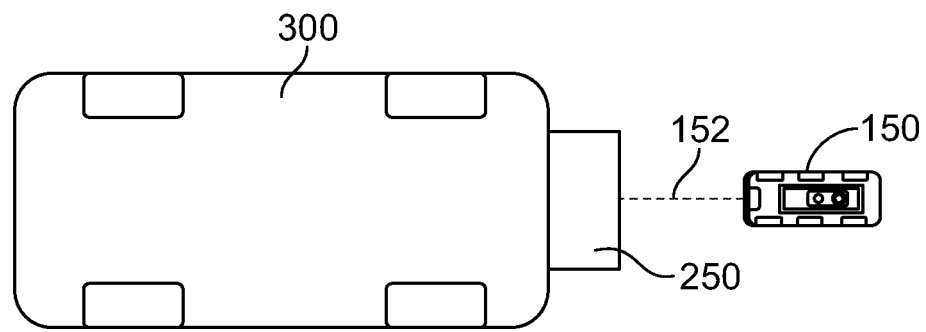
FIG. 9A is a top view of vehicle 300 with focused light beam 152 from focused light beam generator 150 aligned with focused light beam receptor 250 and a centerline of vehicle 300.

FIG. 5A is a perspective view of focused light beam receptor 250, according to an example embodiment. Focused light beam receptor 250 has a T-shaped configuration with a base 260 and a vertical member 270 that extends upwardly from base 260. Other configurations are also possible, such an L-shaped configuration in which a vertical member extends upwardly from one end of a base. Vertical member 270 is a focused light beam receiving surface and includes a vertical marking or slot 280 positioned thereon that is used to align a focused light beam received from a focused light beam generator 150 (shown in FIGS. 6 and 7) to align the focused light beam from the focused light beam generator with the centerline of the vehicle. In operation, the focused light beam receptor 250 is positioned in front of the front end of the vehicle 300 as shown in FIG. 5B. The upwardly extending vertical member 270 may be positioned against the bumper 310 of vehicle 300. As shown in FIG. 9A, the focused light beam receptor 250 is positioned between the front end of the vehicle 300 and a focused light beam generator 150. The focused light beam 152 from the focused light beam generator 150 is aligned with an emblem or marking on the vehicle 300 and aligned with the vertical marking or slot 280 on the focused light beam receiving surface (vertical member) 270 of focused light beam receptor 250 to align and square the focused light beam receptor 250 with the centerline of vehicle 300. In at least some of the implementations, focused light beam receptor 250 is metallic, plastic or at least partially metallic or partially plastic. In at least some of those or other implementations, the vertical member 270 includes vertical markings on opposing sides.

Figure 6:
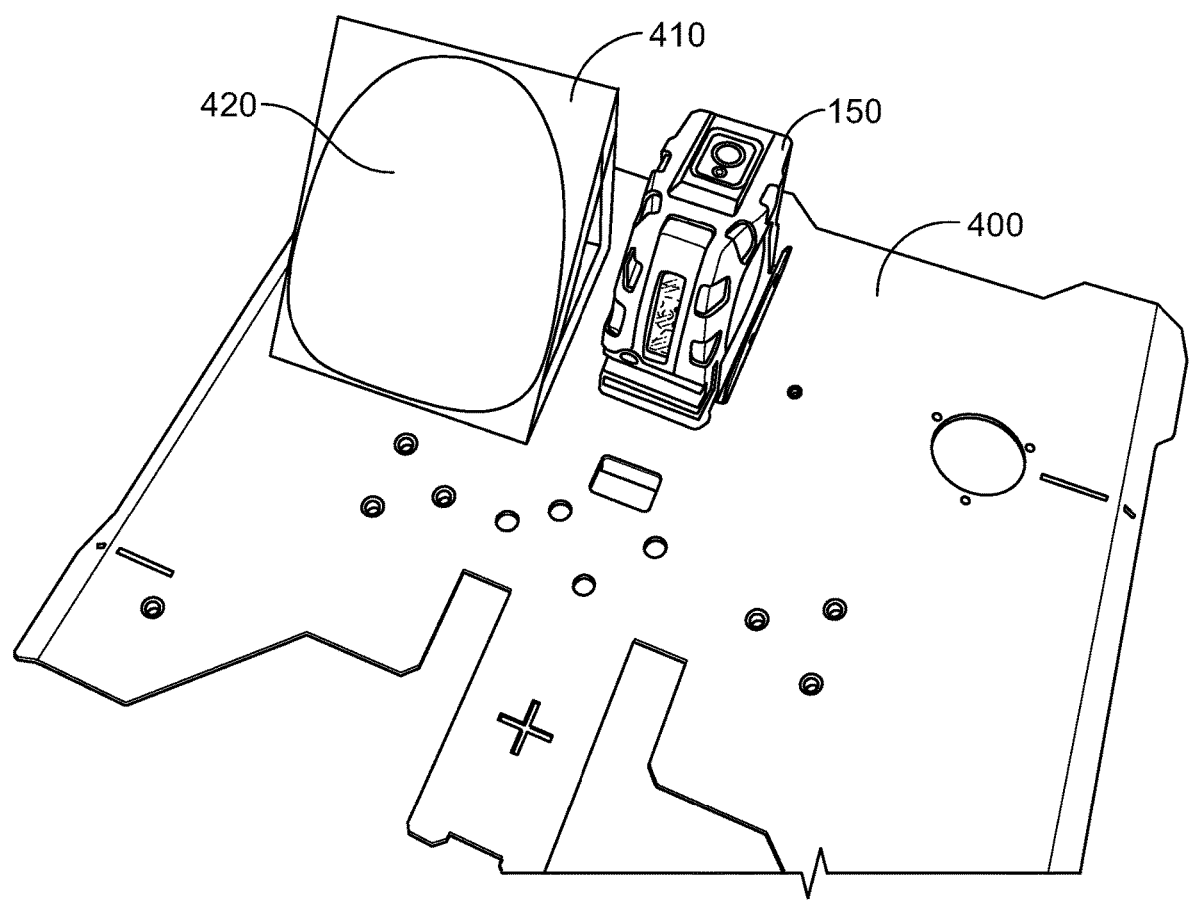
FIG. 6 is a perspective view of focused light beam generator 150 and mirror mount 410 and mirror 420 positioned on base 400.

FIG. 6 is a perspective view of focused light beam generator 150 positioned on a base 400. In addition, a mirror mount 410 is positioned on base 400. Mirror 420 is secured on mirror mount 410. Mirror mount 410 is angled so as to allow a person to view where the focused light beam from focused light beam generator 150 is positioned on focused light beam receptor 250, without having to get down on the ground to look under vehicle 300 to view where the focused light beam is aligned on focused light beam receptor 250.

Figure 7:
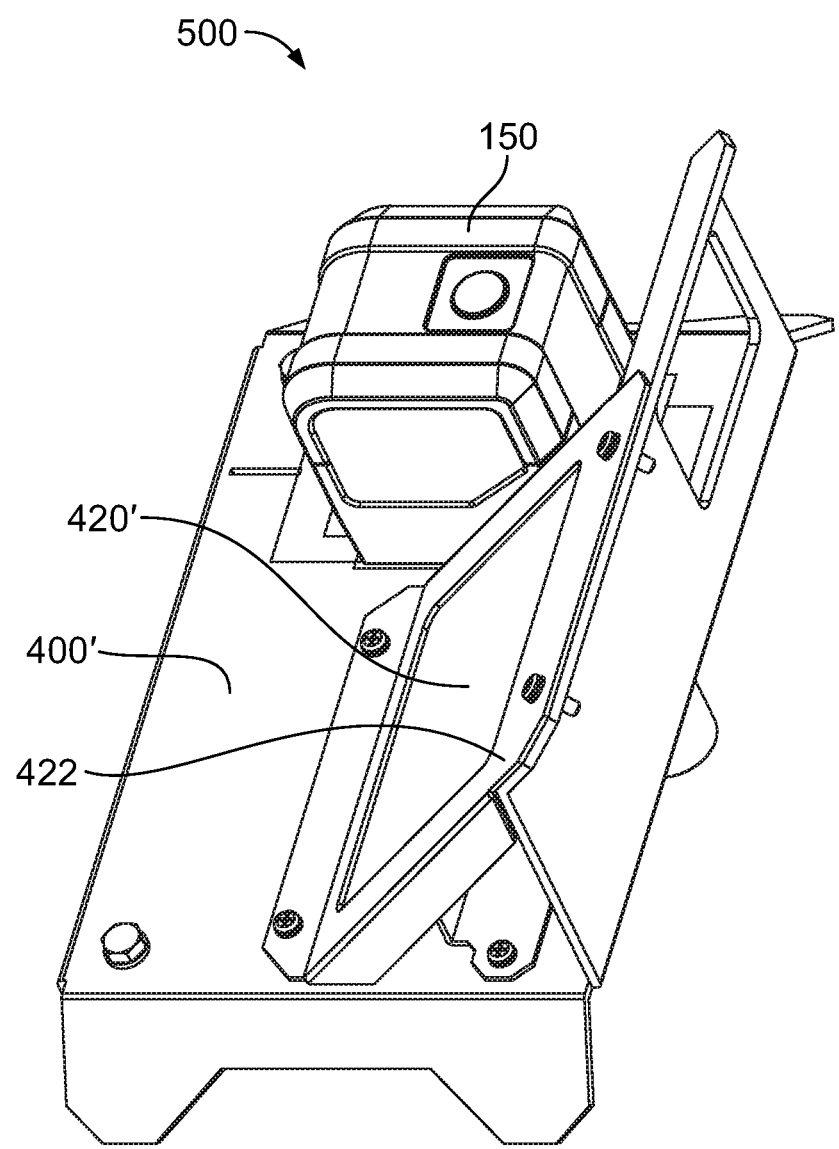
FIG. 7 is a perspective view of an embodiment of focused light beam generator 150 and mirror 420' positioned on base 400'.

FIG. 7 is a perspective view of focused light beam generator apparatus 500, according to an example embodiment. Focused light beam generator apparatus 500 includes a base 400' upon which focused light beam generator 150 is positioned. A mirror 410' is also positioned on base 400' mounted at an angle. Mirror 410' may be mounted at an angle of 30-60 degrees, and in some embodiments advantageously positioned at an angle of 45 degrees. Mirror 410' may be an acrylic mirror secured beneath mirror housing 422. Focused light beam generator 150 is positioned behind the rear end of the vehicle 300, or vice versa. Focused light beam generator 150 directs one or more focused light beams beneath the vehicle 300 and onto the focused light beam receiving surface (vertical member) 270 of focused light beam receptor 250 positioned in front of the vehicle, or vice versa. Focused light beam generator 150 may generate vertical and horizontal focused light beams 152 and 154, and may be a self-leveling laser beam generator. Focused light beam generator 150 may be a Stanley Cubix STHT77340, Johnson 40-6656 self-leveling laser beam generator, as an example The focused light beam generator 150 is adjusted/rotated until the focused light beam is aligned with the vertical marking or slot 280 on the focused light beam receiving surface (vertical member) 270 of the focused light beam receptor 250.

Once properly aligned, the focused light beam receptor 250 is at the proper distance and perpendicular to the vehicle. A mirror such as mirror 420 or 420' may be used to view the alignment of the focused light beams 152, 154, shown here as laser beams on the focused light beam receiving surface (vertical member) 270 of focused light beam receptor 250 or 650 (shown in FIGS. 8A-8F). Once the focused light beams 152, 154 are properly aligned, the focused light beam receptor 250 may be removed (or remain in the case of focused light beam aligner 650) and the movable alignment apparatus 100 may be moved into position in front of the vehicle. The focused light beam aligner 114 on the movable alignment apparatus 100 may be used to insure that the movable alignment apparatus 100 is in a proper position by aligning the laser beams on the vertical marking or slot 157 on focused light beam aligner 114 of movable alignment apparatus 100. A measuring tape may be used to position movable alignment apparatus 100 into a specified or desired distance in front of the vehicle. Once the movable alignment apparatus 100 is properly positioned, a camera or other mounting device may be secured to vehicle 300, or adjusted.

An alternate embodiment of focused light beam receptor 250 shown in FIG. 5A is shown in FIGS. 8A-8F, as focused light beam receptor apparatus 600. Focused light beam receptor apparatus 600 includes a base 602 upon which focused light beam aligner 650 is positioned. Focused light beam aligner 650 includes a marking or slot 660 that is used to align a focused light beam from focused light beam generator 150. Focused light beam receptor apparatus 600 also includes a pair of upright arms 610 and 620 that are positioned against a bumper of the vehicle, in the same manner as vertical member 270 of focused light beam receptor 250 shown in FIG. 5A. Focused light beam receptor apparatus 600 also advantageously includes a focused light beam generator 630 that can be used to align the focused light beam receptor apparatus 600 with the centerline of the vehicle.

The focused light beam receptor apparatus 600 is located against the front middle of the vehicle, the upright arms 610 and 620 are to remain in contact with the bodywork on the front of the vehicle. The focused light beam generator 630 is switched on and projects onto the vehicle centerline feature (usually the logo/emblem) and projects along the lines 660 on the focused light beam aligner 650. This setup is the equivalent of the plumb bob being dropped from the vehicle to establish the first point of the vehicle centerline.

Figure 8A:
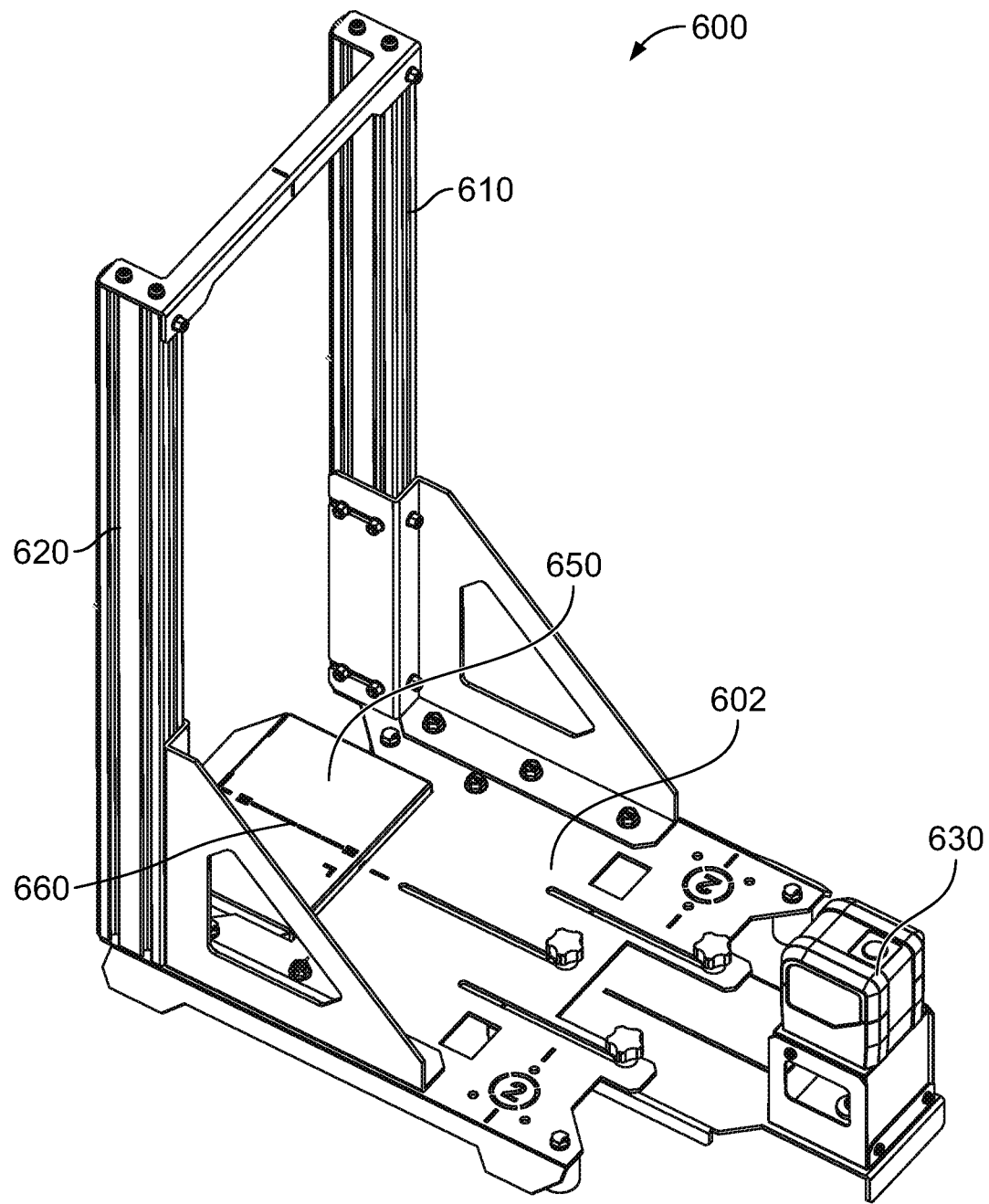
FIG. 8A is a perspective view of focused light beam receptor apparatus 600 with upright arms 610 and 620 extending upwardly from base 602, and focused light beam aligner 650 positioned on the base 602, according to an example embodiment.
Figure 8B:
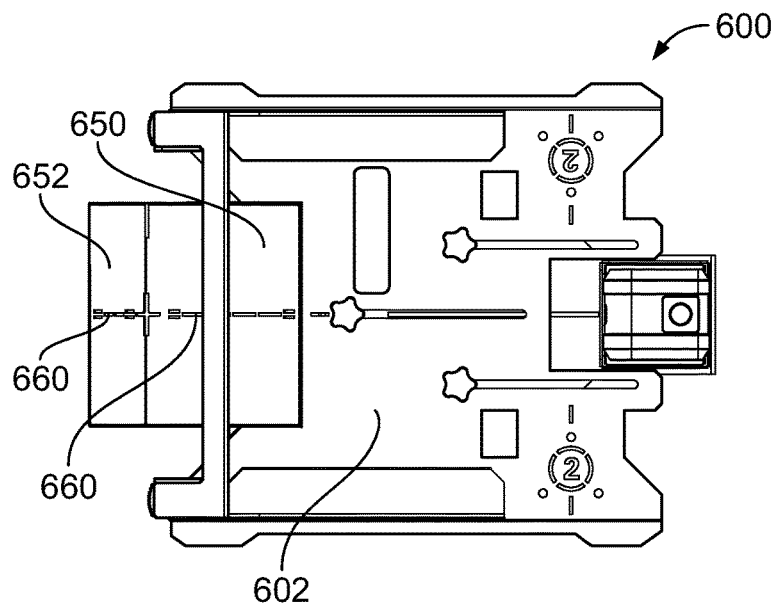
FIG. 8B is a top view of focused light beam receptor apparatus 600 shown in FIG. 8A.
Figure 8C:
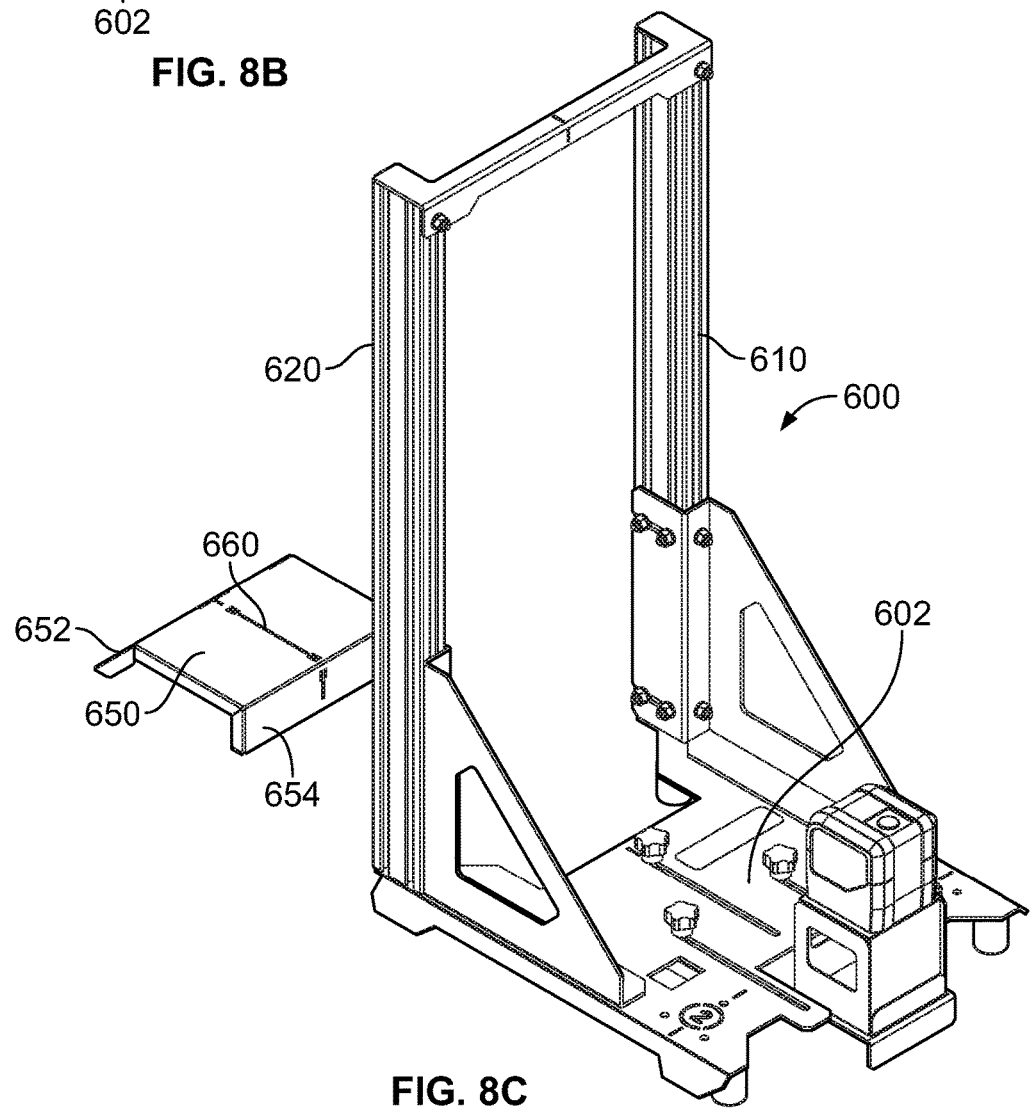
FIG. 8C is a perspective view of focused light beam receptor apparatus 600 shown in FIGS. 8A and 8B with focused light beam aligner 650 separated from base 602.
Figure 8D:
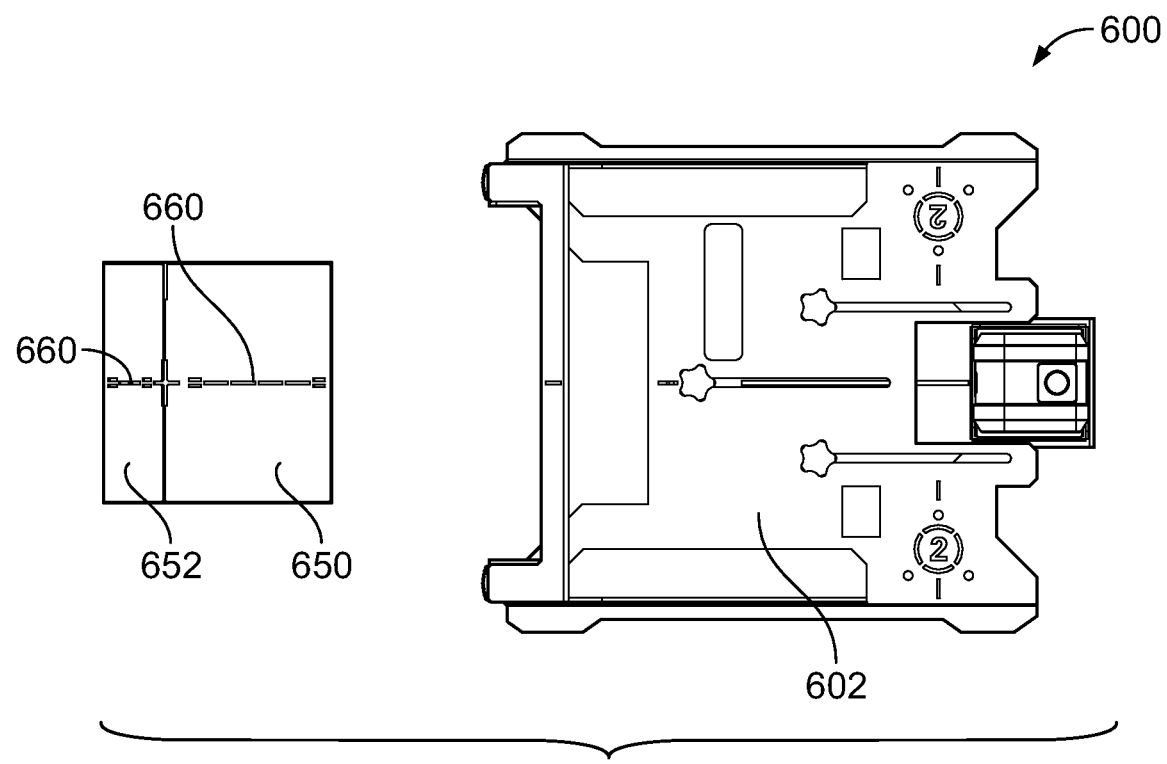
FIG. 8D is a top view of focused light beam receptor apparatus 600 shown in FIG. 8C.
Figure 8E:
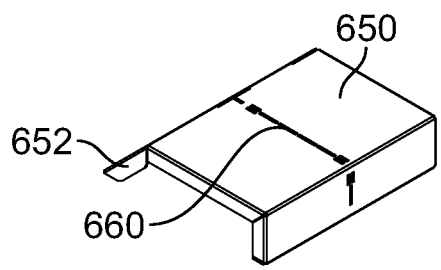
FIG. 8E is a perspective view of focused light beam aligner 650, according to an example embodiment.
Figure 8F:
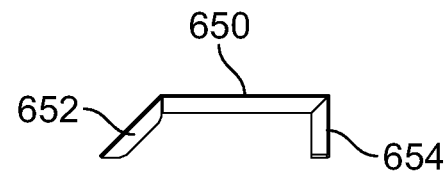
FIG. 8F is a side view of focused light beam aligner 650 shown in FIG. 8E.

As shown in FIGS. 8C and 8D, the focused light beam receptor apparatus 600 is removed leaving the focused light beam aligner 650 in place positioned at the centerline of the vehicle. The focused light beam generator apparatus 500 is positioned on the opposite side of the vehicle from focused light beam aligner 650 offset (middle) at the back of the vehicle. Focused light beam(s) from focused light beam generator 150 (shown in FIG. 7) is projected at the rear vehicle centerline reference (logo/emblem). The mirror 420' is used to view the focused light beam(s) from focused light beam generator 150 as it projects under the vehicle onto focused light beam aligner 650 positioned in alignment at the front of the vehicle. The position of the focused light beam generator apparatus 500 is adjusted until the focused light beam from focused light beam generator 150 projects onto both the rear vehicle reference and the markings on focused light beam aligner 650 along the lines 660. This establishes the vehicle centerline. The movable alignment apparatus 100 (shown in FIGS. 1-4) is then positioned at a set distance (typically 1-2 meters) in front of the vehicle so the focused light beam(s) from focused light beam generator 150 projects onto focused light beam aligner 114 of movable alignment apparatus 100. The movable alignment apparatus 100 is pivoted/rotated until the focused light beams from focused light beam generator 150 projects onto the focused light beam aligner 114 and aligns along the slots 157 on focused light beam aligner 114. This ensures that the movable alignment apparatus 100 is perpendicular to the vehicle centerline.

As shown in FIGS. 8B-8F, the focused light beam aligner 650 includes markings 660 that extend to an angled front surface 652 of focused light beam aligner 650. Focused light beam aligner 650 also includes a rear surface 654 extending downwardly and acts as a footing for focused light beam aligner 650. The rear surface 654 of focused light beam aligner 650 may be removably secured to the base 602 of focused light beam receptor apparatus 600 one or more magnets.

Figure 9B:
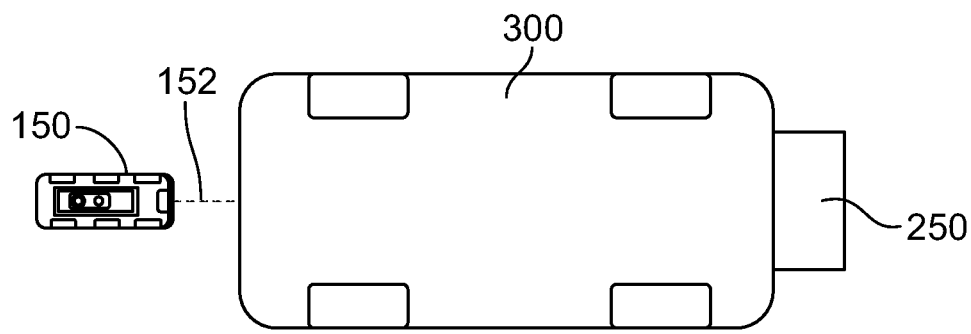
FIG. 9B is a top view of vehicle 300 with focused light beam generator 150 positioned behind the vehicle 300, and a focused light beam receptor 250 positioned in front of the vehicle 300.
Figure 9C:
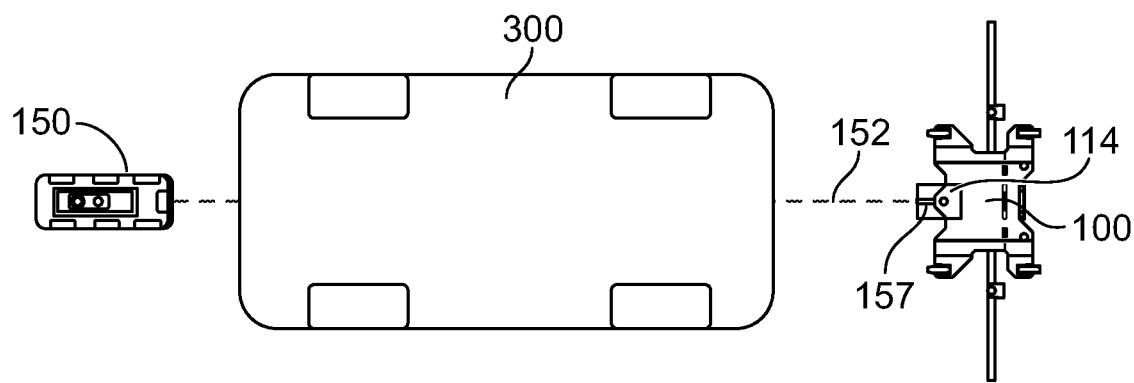
FIG. 9C is a top view of vehicle 300 with focused light beam generator 150 positioned behind the vehicle 300, and a movable alignment apparatus 100 positioned in front of the vehicle 300.

FIG. 9A is a top view of vehicle 300 with focused light beam generator 150 aligning and squaring focused light beam receptor 250 with a centerline of vehicle 300. FIG. 9B is a top view of vehicle 300 with focused light beam generator 150 positioned behind vehicle 300, and focused light beam receptor 250 positioned in front of vehicle 300. Focused light beam generator is then aligned with the centerline of the vehicle and focused light beam receptor 250. Once the focused light beam generator 150 is aligned with the focused light beam receptor 250, the focused light beam receptor 250 is removed and replaced with movable alignment apparatus 100, as shown in FIG. 9C. The focused light beam 152 is used to align focused light beam aligner 114 along markings 157 to properly align and square movable alignment apparatus 100 with the centerline of vehicle 300.

Figure 10A:
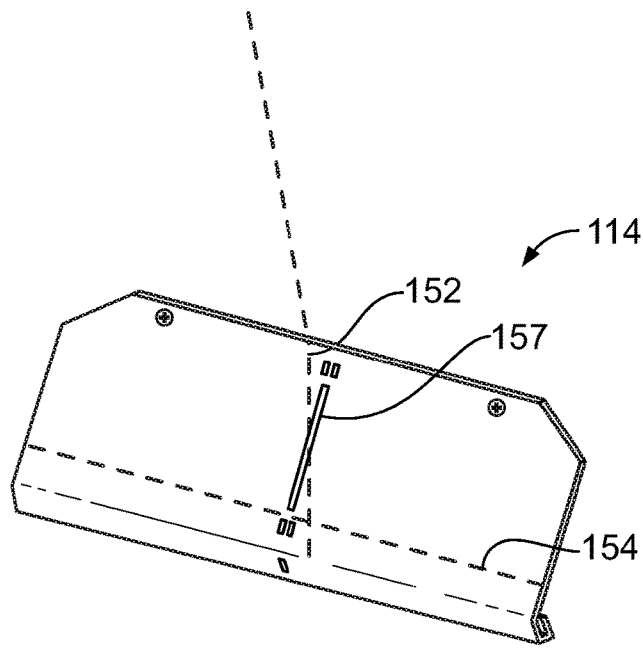
FIG. 10A is a perspective view of focused light beam aligner 114 of movable alignment apparatus 100 with focused light beams 152 and 154 directed thereon, according to an example embodiment.

FIG. 10A is a perspective view of focused light beam aligner 114 of movable alignment apparatus 100 with focused light beams 152 and 154 directed thereon, according to an example embodiment. In this embodiment, focused light beam aligner 114 has an angled focused light beam receiving surface 220 and is used to align the movable alignment apparatus 100 into proper alignment relative to a focused light beam generator 150 (shown in FIGS. 6 and 7) and relative to a centerline of a vehicle. Focused light beam receiving surface 220 may be positioned as an inclined plane at an angle of 30-60 degrees from vertical, and preferably 45 degrees from vertical. As shown in FIG. 10A, focused light beams 152 and 154 are not yet properly aligned on focused light beam receiving surface 220 of focused light beam aligner 114. A vertical marking or slot 157 is positioned on a focused light beam aligner 114.

Figure 10B:
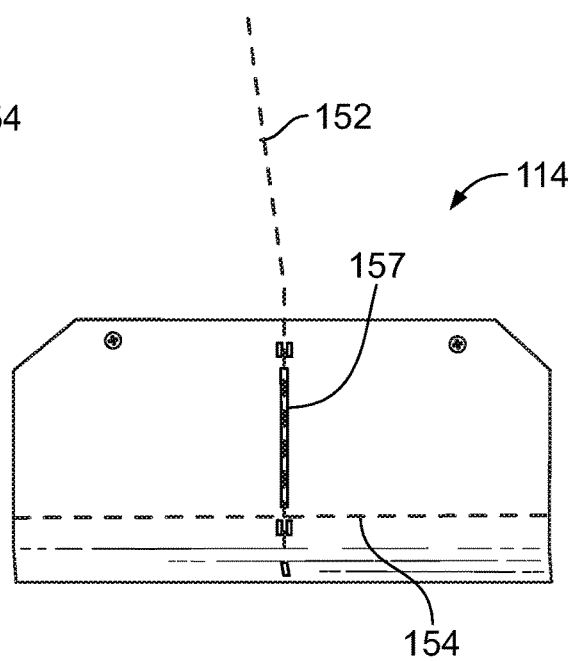
FIG. 10B is another perspective view of focused light beam aligner 114 with focused light beams 152 and 154 directed thereon.

FIG. 10B is another perspective view of focused light beam aligner 114 with focused light beams 152 and 154 directed thereon. In FIG. 10B, the focused light beams 152 and 154 are more centered than in FIG. 10A, but not yet intersecting in a desired center of the vertical marking or slot 157 of focused light beam receiving surface 220 of focused light beam aligner 114.

Figure 10C:
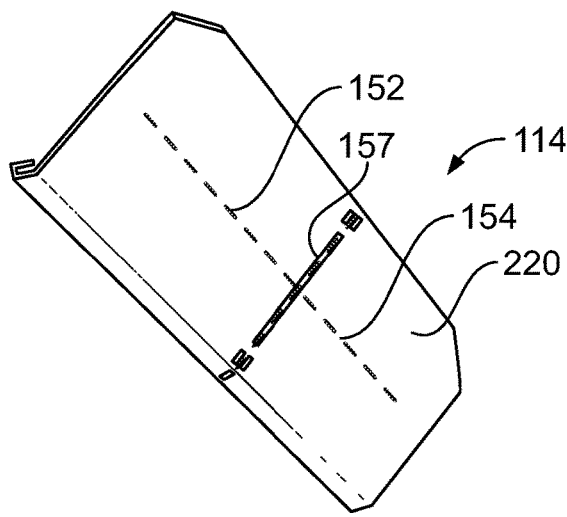
FIG. 10C is yet another perspective view of focused light beam aligner 114 with focused light beams 152 and 154 aligned thereon.

FIG. 10C is yet another perspective view of focused light beam aligner 114 with focused light beams 152 and 154 aligned with vertical marking or slot 157 on focused light beam receiving surface 220 of focused light beam aligner 114. In FIG. 10C, focused light beams 152 and 154 are shown intersecting in the center of vertical marking or slot 157 of focused light beam receiving surface 220 of focused light beam aligner 114, indicating that the movable alignment apparatus 100 is in proper alignment with focused light beam generator 150. Once the movable alignment apparatus 100 is in proper alignment with focused light beam generator 150, then, using movable alignment apparatus 100, a camera or other device may be mounted or adjusted to or with the vehicle 300.

Figure 11:
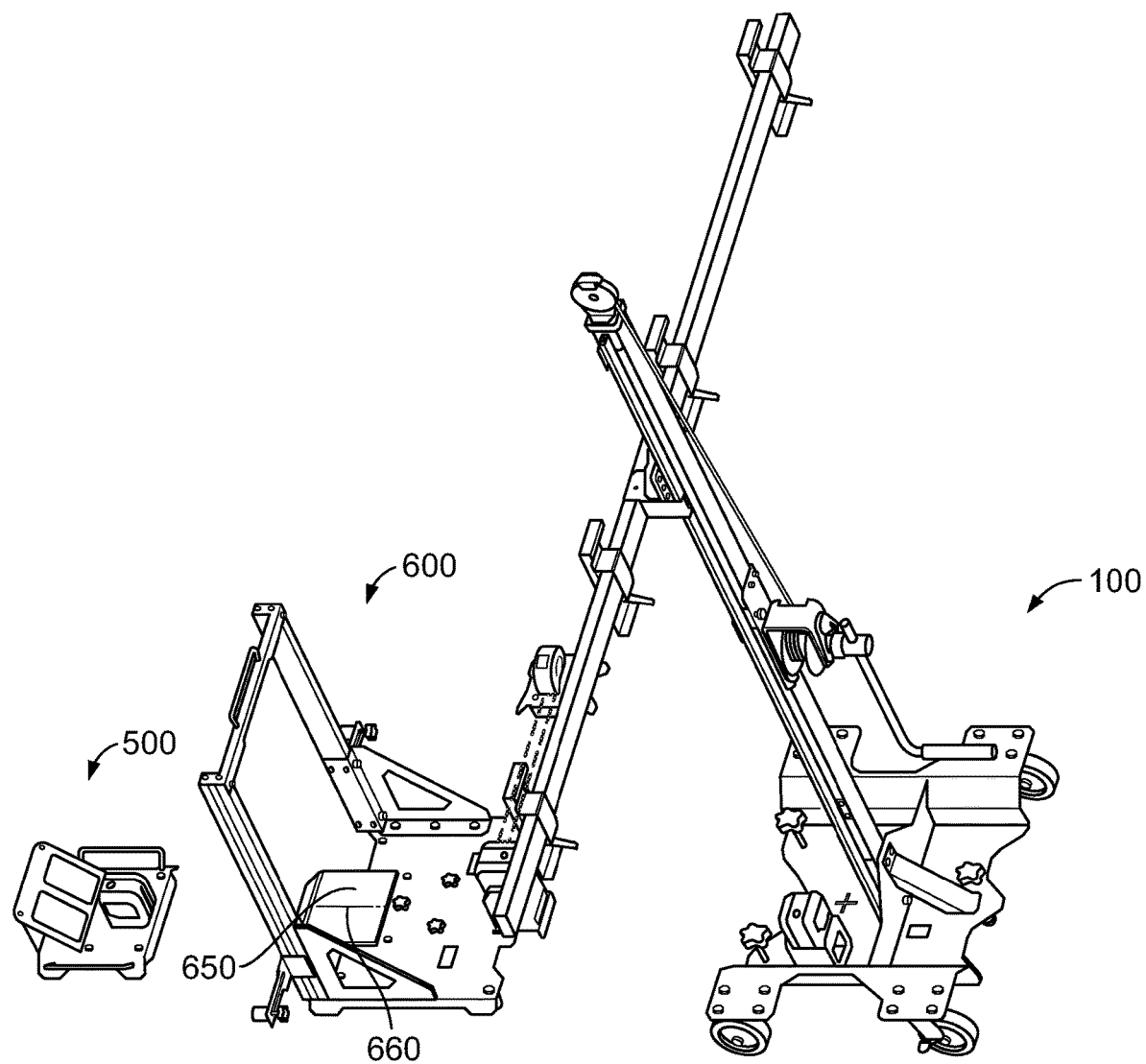
FIG. 11 is a perspective view of focused light beam generator apparatus 500, focused light beam receptor apparatus 600, and movable alignment apparatus 100.

FIG. 11 is a perspective view of the apparatuses used to align movable alignment apparatus 100 with a centerline of a vehicle. Focused light beam receptor apparatus is positioned against a front end of a vehicle, and focused light beam generator 630 is used to align a focused light beam with a centerline of the vehicle and with a focused light beam aligner 650 positioned on focused light beam receptor apparatus 600. Once the focused light beam aligner 650 is aligned and square with the centerline of the vehicle, focused light beam generator apparatus 500 is positioned behind a vehicle and focused light beams are directed onto focused light beam aligner 650 of focused light beam receptor apparatus 600 which is positioned against the bumper of the front of the vehicle to properly align the focused light beam generator 150 with the centerline of the vehicle and the focused light beam receptor. Once the focused light beam generator apparatus 500 is properly aligned with the focused light beam receptor apparatus 600, focused light beam receptor apparatus 600 is removed, leaving the focused light beam aligner 650 in an aligned position in front of the vehicle. Movable alignment apparatus 100 is then moved into place in front of the vehicle. Then the focused light beam aligner 114 on movable alignment apparatus 100 is aligned with the focused light beams from focused light beam generator 150 until the movable alignment apparatus 100 is aligned and squared with the centerline of the vehicle. Once the movable alignment apparatus 100 is in proper alignment square to the centerline of the vehicle, then a camera or other device may be mounted/adjusted to or with the vehicle.

A vehicle, such as the vehicle 300, is a mobile machine that can be used to transport a person, people, or cargo. A vehicle can be driven or otherwise guided along a path (e.g., a paved road or otherwise) on land, in water, or in the air or outer space. A vehicle can be wheeled, tracked, railed, or skied. A vehicle can be guided by a user within the vehicle or by a user outside of the vehicle by use of a remote control. A vehicle can be guided at least partially autonomously. In the case of an autonomous vehicle, the vehicle can at least sometimes be guided along a path without any person or cargo inside or on the vehicle. A vehicle can include an automobile, a motorcycle, an all-terrain vehicle (ATV) defined by ANSI/SVIA-1-2007, a snowmobile, a personal watercraft (e.g., a JET SKI® personal watercraft), a light-duty truck, a medium-duty truck, a heavy-duty truck, a semi-tractor, a farm machine, a van (such as a dry or refrigerated van), a tank trailer, a platform trailer, or an automobile carrier. A vehicle can include or use any appropriate voltage or current source, such as a battery, an alternator, a fuel cell, and the like. A vehicle can include or use any desired drive system or engine. That drive system or engine can include items that use fossil fuels, such as gasoline, natural gas, propane, and the like, electricity, such as that generated by a battery, magneto, fuel cell, solar cell and the like, wind and hybrids or combinations thereof. A vehicle can include an electronic control unit (ECU) 3, a data link connector (DLC) 2, and a vehicle communication link 4 that operatively connects the DLC 2 to the ECU 3. The ECU 3 can detect a malfunction in the vehicle and set a DTC indicative of the malfunction to an active status.

A vehicle manufacturer can build various quantities of vehicles each calendar year (i.e., January $1^{st}$ to December $31^{st}$). Some vehicle manufacturers build one vehicle model or multiple different vehicle models. In some instances, a vehicle manufacturer defines a model year for a particular vehicle model to be built. The model year can start on a date other than January $1^{st}$ and/or can end on a date other than December $31^{st}$. The model year can span portions of two or more calendar years. Two or more different vehicle models built by a vehicle manufacturer during a particular calendar year can have the same or different defined model years. The vehicle manufacturer can build vehicles of a vehicle model with different vehicle options. For example, a particular vehicle model can include vehicles with six-cylinder engines and vehicles with eight-cylinder engines. The vehicle manufacturer or another entity can define vehicle identifying information for each vehicle model built by the vehicle manufacturer. Particular vehicle identifying information identifies particular sets of vehicles (e.g., all vehicles of a particular vehicle model for a particular vehicle model year or all vehicles of a particular vehicle model for a particular vehicle model year with a particular set of one or more vehicle options).

As an example, the particular vehicle identifying information can include indicators of characteristics of the vehicle such as when the vehicle was built (e.g., a vehicle model year), who built the vehicle (e.g., a vehicle make (i.e., vehicle manufacturer)), marketing names associated with vehicle (e.g., a vehicle model name), and features of the vehicle (e.g., an engine type). In accordance with that example, the particular vehicle identifying information can be referred to by an abbreviation YMME or Y/M/M/E, where each letter in the order shown represents a model year identifier, vehicle make identifier, vehicle model name identifier, and engine type identifier, respectively, or an abbreviation YMM or Y/M/M, where each letter in the order shown represents a model year identifier, vehicle make identifier, and vehicle model name identifier, respectively. An example Y/M/M/E is 2004/Toyota/Camry/4Cyl, in which "2004" represents the model year the vehicle was built, "Toyota" represents the name of the vehicle manufacturer Toyota Motor Corporation, Aichi Japan, "Camry" represents a vehicle model name built by that manufacturer, and "4Cyl" represents an engine type (i.e., a four cylinder internal combustion engine (ICE)) within the vehicle. A person skilled in the art will understand that other features in addition to or as an alternative to "engine type" can be used to identify a vehicle model using particular vehicle identifying information, and for some purposes, a vehicle model could be identified by its vehicle make and vehicle model name M/M. These other features can be identified in various manners, such as a regular production option (RPO) code, such as the RPO codes defined by the General Motors Company LLC, Detroit Mich. Furthermore, the vehicle identifying information can be combined and displayed as a vehicle identification number (VIN). The VIN can be displayed on a VIN label.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the claims, along with the full scope of equivalents to which such claims are entitled. It is also to be understood that the terminology used herein is for the purpose of describing particular embodiments only, and is not intended to be limiting.

What is claimed is:

1. An apparatus, comprising:
   a focused light beam receptor apparatus configured to be positioned proximate a first end of a vehicle;
   a focused light beam generator is positioned at a second end of the vehicle opposite from the first end; and
   a focused light beam aligner is positioned on a base of the focused light beam receptor apparatus; and
   wherein the focused light beam receptor apparatus includes a focused light beam receiving surface, positioned on the focused light beam aligner for receiving an unreflected focused light beam directly from the focused light beam generator to provide alignment of the focused light beam receptor apparatus relative to a centerline of the vehicle;
   wherein the focused light beam receptor apparatus comprises a pair of upright arms configured to abut the first end of the vehicle; and
   wherein the focused light beam receiving surface is secured to the base of the light beam receptor apparatus between the pair of upright arms.

2. An apparatus, comprising:
   a focused light beam receptor apparatus configured to be positioned proximate a first end of a vehicle;
   a first focused light beam generator positioned in front of a second end of the vehicle located opposite from the focused light beam receptor apparatus; and
   a focused light beam aligner is positioned on a base of the focused light beam receptor apparatus;
   wherein the focused light beam aligner includes a focused light beam receiving surface positioned at a level below a bottom of the vehicle for receiving an unreflected focused light beam directly from the first focused light beam generator to provide alignment of the focused light beam receptor relative to a centerline of the vehicle.

3. An apparatus, comprising:
   a focused light beam receptor apparatus configured to be positioned proximate a first end of a vehicle;

a first focused light beam generator positioned in front of a second end of the vehicle located opposite from the focused light beam receptor apparatus; and a focused light beam aligner is positioned on a base of the focused light beam receptor apparatus;

wherein the focused light beam aligner includes a focused light beam receiving surface for receiving a focused light beam directly from the first focused light beam generator to provide alignment of the focused light beam receptor relative to a centerline of the vehicle;

wherein a second focused light beam generator is positioned on the base of the focused light beam receptor apparatus behind the focused light beam aligner.

4. The apparatus of claim 1, wherein the focused light beam aligner is positioned between the pair of upright arms.

5. The apparatus of claim 1, wherein the focused light beam receptor apparatus has a T-shaped member with a base and a vertical member upwardly extending from a central portion of the base.

6. The apparatus of claim 5, wherein the focused light beam receiving surface is on the vertical member.

7. The apparatus of claim 1, wherein the focused light beam receiving surface includes a marking or slot onto which one or more focused light beams from the focused light beam generator are aligned to provide alignment of the focused beam generator relative to the vehicle.

8. The apparatus of claim 1, wherein the focused light beam aligner includes an angled front surface.

9. The apparatus of claim 1, wherein the focused light beam aligner is removably secured to the base of the focused light beam receptor apparatus.

10. The apparatus of claim 1, further including:
wheels secured to the base.

11. The apparatus of claim 1, wherein the focused light beam aligner includes a vertical marking or vertical slot.

12. The apparatus of claim 1, wherein a mirror mount is positioned adjacent the focused light beam generator, and a mirror is positioned on the mirror mount.

13. The apparatus of claim 12, wherein the mirror mount is angled from vertical.

14. The apparatus of claim 13, wherein the focused light beam generator and the mirror mount are positioned on a base.

15. The apparatus of claim 1, further including a mirror mount positioned on a second base; and
a mirror secured to the mirror mount.

16. The apparatus of claim 15, wherein mirror mount and mirror positioned at an angle of 30 to 60 degrees from vertical.

17. The apparatus of claim 16, wherein the mirror is an acrylic mirror.

18. A focused light beam receptor apparatus comprising:
a base;
a vertical member extending upwardly from the base;
a focused light beam aligner positioned on the base;
a focused light beam generator positioned on a centerline of the base behind the focused light beam aligner;
wherein the focused light beam aligner includes a focused light beam receiving surface positioned for receiving an unreflected focused light beam directly from the focused light beam generator to provide alignment of the focused light beam aligner relative to a centerline of a vehicle;
wherein the vertical member comprises a pair of upright arms configured to abut an end of the vehicle; and wherein the focused light beam receiving surface is secured to the base of the focused light beam receptor apparatus between the pair of upright arms.

19. The focused light beam receptor apparatus of claim 18, wherein the focused light beam aligner is positioned between the pair of upright arms.

20. The focused light beam receptor apparatus of claim 18, wherein the focused light beam aligner includes a marking or slot extending towards a front of the focused light beam aligner.

21. The focused light beam receptor apparatus of claim 20, where the marking or slot extends to an angled face of the focused light beam aligner.

22. The focused light beam receptor apparatus of claim 18, wherein a second focused light beam generator is positioned on the base of the focused light beam receptor apparatus behind the focused light beam aligner.

23. A method, comprising:
providing a focused light beam receptor apparatus configured to be positioned proximate a first end of a vehicle, a first focused light beam generator positioned in front of a second end of the vehicle located opposite from the focused light beam receptor apparatus; and a focused light beam aligner is positioned on a base of the focused light beam receptor apparatus, wherein the focused light beam aligner includes a focused light beam receiving surface for receiving a focused light beam directly from the first focused light beam generator to provide alignment of the focused light beam receptor relative to a centerline of the vehicle;
wherein a second focused light beam generator is positioned on the base of the focused light beam receptor apparatus behind the focused light beam aligner;
positioning the focused light beam receptor proximate the first end of the vehicle;
positioning the focused light beam generator such that the focused light beam receptor is between the first end of the vehicle and the focused light beam generator;
directing one or more focused light beams towards the centerline of the vehicle and towards the focused light beam receiving surface on the focused light beam receptor for aligning and squaring the focused light beam receptor with the centerline of the vehicle;
positioning the focused light beam generator on an opposite end of the vehicle from the first end of the vehicle;
directing one or more focused light beams from the focused light beam generator onto the focused light beam receiving surface of the focused light beam receptor; and
aligning the one or more focused light beams on the focused light beam receiving surface of the focused light beam receptor to provide alignment of the focused light beam generator relative to the centerline of the vehicle.

24. The method of claim 23, wherein the focused light beam receptor has a focused light beam aligner.

25. The method of claim 24, wherein the focused light beam aligner is removably secured to a base of the focused light beam receptor.

26. The method of claim 25, wherein the focused light beam receptor includes a pair of upright arms and a focused light beam generator positioned on the base of the focused light beam receptor.

27. The method of claim 25, wherein the focused light beam aligner includes a line or slot for aligning the one or more focused light beams from the focused light beam generator with the focused light beam aligner.

28. The method of claim 25, further including removing the base of the focused light beam receptor from the focused light beam aligner.

29. The method of claim 23, wherein the focused light beam receptor is a T-shaped member with a base and a vertical member upwardly extending from a central portion of the base.

30. The method of claim 29, wherein the focused light beam receiving surface is on the vertical member.

31. The method of claim 30, wherein the focused light beam receiving surface includes a vertical marking or slot onto which the one or more focused light beams from the focused light beam generator are aligned to align and square the focused light beam receptor with the centerline of the vehicle.

32. The method of claim 23, further including the step of:
providing a movable alignment stand comprising:
a base;
wheels secured to the base;
a vertical member extending upwardly from the base;
a horizontal member extending from the vertical member; and
a focused light beam aligner positioned on the base; and
once the focused light beam generator is properly aligned with the centerline of the vehicle, removing the focused light beam receptor and replacing the focused light beam receptor with the movable alignment stand positioned in a path of the one or more focused light beams from the focused light beam generator.

33. The method of claim 32, further including aligning the one or more focused light beams with the focused light beam aligner on the base of the movable alignment stand.

34. The method of claim 33, wherein the focused light beam aligner includes a vertical marking or vertical slot.

35. The method of claim 23, further including the step of using a mirror to see the alignment of the one or more focused light beams on the focused light beam receiving surface of the focused light beam receptor.

36. The method of claim 35, wherein the mirror is mounted on a mirror mount positioned adjacent the focused light beam generator.

37. The method of claim 36, wherein the mirror mount is angled from vertical.

38. The method of claim 37, wherein the focused light beam generator and the mirror mount are positioned on a base.

* * * * *